United States Patent [19]

Suzuki et al.

[11] 4,397,800
[45] Aug. 9, 1983

[54] CERAMIC BODY HAVING A METALLIZED LAYER

[75] Inventors: Go Suzuki, Nagoya; Kazuo Michishita, Fujiyoshida, both of Japan

[73] Assignee: NGK Insulators, Ltd., Nagoya, Japan

[21] Appl. No.: 242,665

[22] Filed: Mar. 11, 1981

Related U.S. Application Data

[62] Division of Ser. No. 48,455, Jun. 14, 1979.

[30] Foreign Application Priority Data

Jun. 17, 1978 [JP] Japan .................. 53-73430

[51] Int. Cl.³ .................................... H01G 1/01
[52] U.S. Cl. ............................. 264/61; 264/62
[58] Field of Search ........................... 264/61, 62

[56] References Cited

U.S. PATENT DOCUMENTS

| | | | |
|---|---|---|---|
| 2,938,806 | 5/1960 | Padula | 264/62 |
| 3,031,316 | 4/1962 | Cavanaugh | 264/62 |
| 3,486,222 | 12/1969 | Schimmel | 264/62 |
| 3,520,054 | 7/1970 | Pensack | 264/61 |
| 3,544,287 | 12/1970 | Shays | 264/61 |
| 3,549,784 | 12/1970 | Hargis | 264/61 |
| 4,137,628 | 2/1979 | Suzuki | 264/61 |
| 4,241,378 | 12/1980 | Dorrian | 264/61 |
| 4,313,900 | 2/1982 | Gonzales | 264/61 |
| 4,340,618 | 7/1982 | Fury | 264/61 |
| 4,345,955 | 8/1982 | Bakermans | 264/61 |
| 4,347,650 | 9/1982 | McLainey | 264/61 |

Primary Examiner—John A. Parrish
Attorney, Agent, or Firm—Bert J. Lewen; Charles A. Blank

[57] ABSTRACT

A ceramic body having a metallized layer which comprises a ceramic substrate and a metallized layer fired on the substrate to be integrated or further comprises a conductive layer consisting of a noble metal or noble metal alloy to be joined onto the metallized layer, the composition of the metallized layer being one or more of a silicide of transition metals belonging to Groups V and VI of periodic table; one or more of a boride of lanthanum and a boride of transition metals belonging to Groups IV, V and VI of periodic table; or a high melting point metal or alloy unmelted at a firing temperature of the ceramic substrate and containing, based on 100 parts by weight of the metal or alloy, 0.5–25 parts by weight of niobium, 0.5–10 parts by weight of yttrium, 0.5–10 parts by weight of tantalum, 0.5–25 parts by weight of mixture of niobium and yttrium, 0.5–25 parts by weight of mixture of yttrium and tantalum, 0.5–25 parts by weight of mixture of niobium and tantalum, 0.5–25 parts by weight of mixture of niobium, yttrium and tantalum, 0.05–3 parts by weight of nickel, 0.5–4 parts by weight of chromium or 0.05–3 parts by weight of mixture of nickel and chromium, which is a useful material for various electronic and electric apparatuses.

4 Claims, 5 Drawing Figures

CERAMIC BODY HAVING A METALLIZED LAYER

This is a division of application Ser. No. 048,455, filed June 14, 1979.

This invention relates to a ceramic body having an electrically conductive metallized layer which is useful as a material for thick film circuit substrates for hybrid integrated circuits, ceramic heaters and many other electronic and electric apparatuses.

Figure 4:
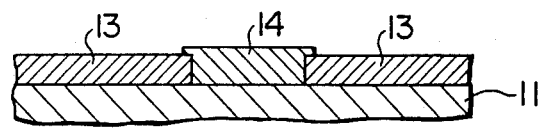

On ceramic bodies used as a material for electronic and electric apparatuses, an electrically conductive layer is usually formed by joining a conductive layer (13) consisting of a noble metal or a noble metal alloy such as gold, silver, silver-palladium alloy to a fired ceramic plate (11), as shown in the thick film circuit substrate of accompanying FIG. 4. However, this type of products is deficient because it needs a large quantity of noble metal and therefore is expensive. In order to overcome this deficiency, there has been disclosed a product constructed, as shown in the accompanying FIG. 5. This thick film circuit substrate has a metallized layer (12) consisting of a high melting point metal such as tungsten, molybdenum or the like, which are less expensive than the noble metals, on a fired ceramic plate (11). The contact part of said metallized layer (12) is coated with an insulating layer (15) made of, for example, a ceramic layer having through-holes (18). These through-holes (18) are filled with gold, silver, silver-palladium alloy or the like constituting an oxidation-proofing noble metal part (17) so that the surface of the metallized layer (12) becomes entirely free from exposure. The oxidation-proofing noble metal part (17) is joined onto a conductive layer (13) so that the metallized layer (12) is completely covered with said noble metal part (17) and the insulating layer (15). Therefore the metallized layer (12) can be protected against oxidation even in the oxidative atmosphere used for firing the conductive layer (13) consisting of a noble metal or a noble metal alloy and the resistor (14). This type of product is advantageous over the product of FIG. 4 in that the amount of expensive noble metal or noble metal alloy is lessened by replacing it by a less expensive high melting point metal. However, the product still has a problem in respect of mass production because the above-mentioned complicated coating procedures are required to protect against oxidation even in the oxidative atmosphere occurring at the time of firing the conductive layer (13) and the resistor (14). Moreover, pin holes are often formed in the oxidation-proofing noble metal part (17), owing to which the metallized layer (12) is frequently oxidized in the process of oxidative firing of the conductive layer (13) and the resistor (14). As a result defective articles form and the function of thick film circuit substrate stops. In view of above, it has been desirable to develop a ceramic body having a metallized layer which can be mass produced less expensively and having the metallized layer excellent both in electric conductivity and adhesive strength to the ceramic substrate.

This invention relates to a ceramic body having a metallized layer which satisfies the above-mentioned desires. Hereafter, embodiments of this invention will be illustrated with reference to the thick film circuit substrates shown in the accompanying FIGS. 1, 2 and 3.

Figure 1:
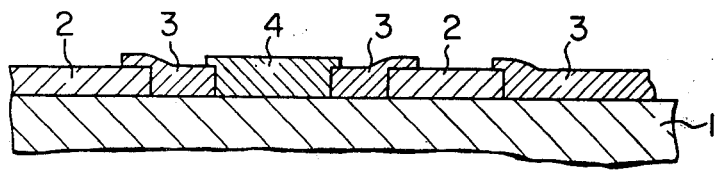
Figure 2:
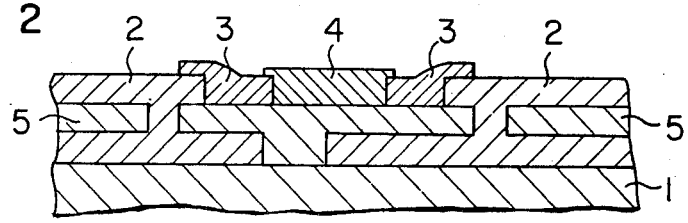
Figure 3:
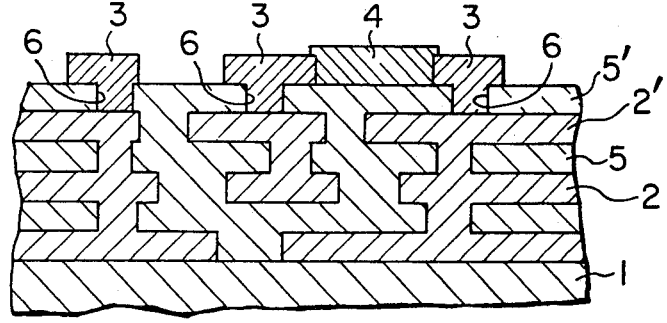
Figure 5:
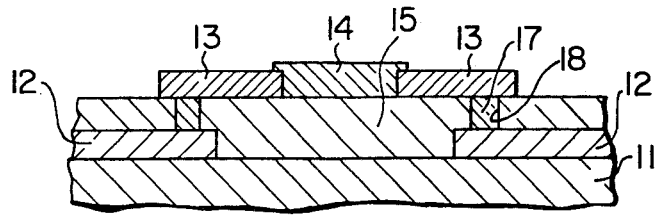

FIG. 1 is a partially cutaway sectional view of the thick film circuit substrate illustrating an embodiment of this invention. FIG. 2 and FIG. 3 are partially cutaway sectional views of the thick film circuit substrate illustrating other embodiments of this invention. FIGS. 4 and 5 are partially cutaway sectional views of conventional thick film circuit substrate.

In FIG. 1, (1) is a ceramic substrate. On the upper surface of the substrate (1), there is formed a fired and integrated metallized layer (2) at the appointed position. Said metallized layer (2) is joined onto a conductive layer (3) consisting of a noble metal or a noble metal alloy. The composition of said metallized layer (2) is one or more of the silicides of the transition metals of Groups V and VI of periodic table; one or more of the borides of lanthanum or of the transition metals of Groups IV, V and VI of periodic table; or a high melting point metal or alloy unmelted at a firing temperature of the ceramic substrate (1) and containing, based on 100 parts by weight of the metal or alloy, 0.5–25 parts by weight of niobium, 0.5–10 parts by weight of yttrium, 0.5–10 parts by weight of tantalum, 0.5–25 parts by weight of mixture of niobium and yttrium, 0.5–25 parts by weight of mixture of yttrium and tantalum, 0.5–25 parts by weight of mixture of niobium and tantalum, 0.5–25 parts by weight of mixture of niobium, yttrium and tantalum, 0.05—3 parts by weight of nickel, 0.5–4 parts by weight of chromium or 0.05-3 parts by weight of mixture of nickel and chromium. On said conductive layer (3) is a resistor (4).

Where the metallized layer (2) is formed into a special multi-layer construction as shown in the embodiment of FIG. 2, an insulating layer (5) consisting of ceramics or the like is inserted between the layers constituting the metallized layer (2) and integrated therewith.

Further, in the embodiment shown in FIG. 3, the multi-layers are formed from metallized layer (2) and insulating layers (5) consisting of ceramics or the like. The uppermost layer (5') of insulating layer (5) has through-holes or slits (6) on the uppermost layer (2') of metallized layer (2) so that the uppermost layer (2') of metallized layer (2) and the conductive layer (3) come in mutual contact or continuity. In this case, the metallized layer (2) is completely enclosed by the insulating layer (5) and the conductive layer (3) so as to better protect the metallized layer (2) from atmospheric conditions such as moisture. It is possible to utilize the existing insulating layer (5) as it is, and also to form condensers by replacing the insulating layer partially or wholly by a dielectric layer.

The product thus constructed is used after attaching semi-conductors, condensers, lead wires and the like by means of Pb-Sn or Au-Si solder, electrically conductive synthetic resin or the like, in the same manner as in the usual thick film circuit substrates. In this type of product, the major part of the conductive layer is the metallized layer (2) fired onto the upper surface of a fired ceramic substrate (1). The conductive layer (3) consisting of expensive noble metal or noble metal alloy is used only in the limited necessary parts. Accordingly the product of this invention can be offered far less expensively than conventional products. In addition, the metallized layer (2) is, owing to the composition described above, an excellent conductor in all cases and also has a very good compatibility with the ceramic substrate (1) so as to give a high adhesive strength. Furthermore, when a ceramic body having the metallized layer (2) is fired at the time of manufacture for the purpose of joining it to conductive layer (3) or a resistor, the metallized layer (2) is resistant to oxidation and its appropriate conductive function is not injured in any of the above-mentioned cases. Further, among the various types of metallized layers (2) mentioned above, that composed of a high melting point metal or alloy unmelted at the firing temperature of the ceramic substrate such as molybdenum, tungsten, tungsten carbide or the like and containing, based on 100 parts by weight of the metal or alloy, the specified quantities of niobium, yttrium, tantalum, niobium-yttrium mixture, yttrium-tantalum mixture, niobium-tantalum mixture, niobium-yttrium-tantalum mixture, nickel, chromium or nickel-chromium mixture is limited in composition as expressed by the aforementioned numerical figures. If the quantity of the additive elements is smaller than the lower limits, the high melting point metal or alloy constituting the main component of metallized layer is oxidized when the conductive layer and the resistor are fired in an oxidative atmosphere in the manufacture of the thick film circuit substrate. In such case, the metallized layer loses conductivity and its function is damaged. If the quantity of the additive element exceeds the higher limit, the adhesion between the ceramic substrate (1) and the metallized layer (2) becomes poor so that the metallized layer (2) peels off from the ceramic substrate (1) and its function is lost when an external force is applied before or after setting the thick film circuit substrate into an electronic apparatus or in the course of using the apparatus. Only when the composition of metallized layer (2) is in conformity with the above-mentioned values, can the metallized layer (2) maintain its electric conductivity without undergoing oxidation in the process of manufacture and, not peel off from the ceramic substrate (1). Only if the composition is used can the thick film circuit substrate perform its intended function after being joined to a conductive layer (3) consisting of a noble metal or a noble metal alloy and further to resistors, lead wires, semi-conductors, condensers, filters and the like.

To produce the above-mentioned thick film circuit substrate as an example of ceramic body having such metallized layer, a raw powder such as alumina, beryllia, forsterite or the like is mixed first with fluxes and then with an organic binder such as polyvinyl butyral and an organic solvent such as toluene, butanol or the like. After the mixture is kneaded and defoamed under vacuum, it is formed into a ceramic green sheet by tape casting method, extrusion, etc. The ceramic green sheet is punched out to be an appropriate dimension and shape, subjected to an appropriate through hole-punching process, and then subjected to an appropriate through hole-printing process with a paste which comprises materials for realizing the aforementioned composition of metallized layer and conventional additives. Said conventional additives consist of fluxes such as glass, ceramics or the like; a sintering agent such as titanium, manganese or the like; a binder such as ethyl cellulose or the like; and a solvent such as butyl carbitol or the like. Thus, there is obtained a ceramic green sheet having an electric continuity from upper side to lower side. One surface or both surfaces of the green sheet itself or a ceramic substrate obtainable by firing the green sheet is alternately printed with the above-mentioned paste and an insulating layer consisting of a high melting point ceramics or glass such as alumina, beryllia, magnesia-alumina-silica type glass or the like to form multi-layers. In this case, the intermediate metallized layers are so formed that they are electrically connected mutually at the position of through-holes.

Then, the above-mentioned metallized-layer-forming paste is printed onto the uppermost part to form a printed layer and it is fired at 1,450° C. to 1,600° C. in a reducing atmosphere to give a basic circuit substrate. Of course, it is also allowable to print only the metallized layer-forming paste, without combination with insulating layer, onto the ceramic green sheet or a ceramic substrate obtained by firing the green sheet and then to fire the printed sheet or substrate. It is also allowable to form a printed condenser by utilizing the above-mentioned paste as the upper and lower electrodes. Then, the terminals through which resistors, condensers, semi-conductors, lead wires and the like are to be attached to the basic circuit substrate in the subsequent step are printed with a conductive paste comprising a noble metal or a noble metal alloy such as gold, silver, silver-palladium alloy or the like and fired at 500° C. to 900° C. in an oxidative atmosphere. Then it is printed with a thick film resistor paste and again fired at 500° C. to 900° C. in an oxidative atmosphere. Finally, semi-conductors, condensers, lead wires and the like are attached by means of Pb-Sn or Au-Si solder, an electrically conductive synthetic resin or the like.

Although the description given above deals only with a thick film circuit substrate as one embodiment of this invention, it is needless to say that this invention can be applied to all the ceramic bodies used as a material for various electronic and electric apparatuses in which a metallized layer, as a conductive layer, is fired and integrated with a ceramic substrate, such as ceramic packages, ceramic heater and the like.

Next, a linear printed layer having a width of 5 mm and a length of 50 mm, as a metallized pattern, is formed on the whole span of a substrate from its one end to the other end, the printed layer is fired in an atmosphere of decomposed ammonia gas at 1,550° C. to convert it into an integrated metallized layer, a silver-palladium conductive paste is printed on the both lateral faces of the substrate so that the paste joins onto the both ends of the metallized layer, and it is fired at 760° C. in an oxidative atmosphere to give a silver-palladium conductive part. Resistance of the product thus obtained is shown in the following table, wherein Samples 1–33 are ceramic bodies having a metallized layer of this invention while Comparative Samples 1'–5' are ceramic bodies of which metallized layer consists only of a high melting point metal or a high melting point alloy unmelted at the firing temperature of the ceramic substrate.

| Sample | Composition of conductive material in metallized layer (parts by weight) | | Resistance ($\Omega$) (Evaluation) |
|---|---|---|---|
| 1 | Vanadium silicide | 100 | Under 0.2 $\Omega$ (Acceptable) |
| 2 | Niobium silicide | 100 | Under 0.2 $\Omega$ (Acceptable) |
| 3 | Tantalum silicide | 100 | Under 0.2 $\Omega$ (Acceptable) |
| 4 | Chromium silicide | 100 | Under 0.2 $\Omega$ (Acceptable) |
| 5 | Molybdenum silicide | 100 | Under 0.2 $\Omega$ (Acceptable) |
| 6 | Tungsten silicide | 100 | Under 0.2 $\Omega$ (Acceptable) |
| 7 | Titanium boride | 100 | Under 0.2 $\Omega$ (Acceptable) |
| 8 | Zirconium boride | 100 | Under 0.2 $\Omega$ (Acceptable) |
| 9 | Hafnium boride | 100 | Under 0.2 $\Omega$ (Acceptable) |
| 10 | Vanadium boride | 100 | Under 0.2 $\Omega$ |

-continued

| Sample | Composition of conductive material in metallized layer (parts by weight) | | Resistance (Ω) (Evaluation) |
|---|---|---|---|
| 11 | Niobium boride | 100 | Under 0.2 Ω (Acceptable) |
| 12 | Tantalum boride | 100 | Under 0.2 Ω (Acceptable) |
| 13 | Chromium boride | 100 | Under 0.2 Ω (Acceptable) |
| 14 | Molybdenum boride | 100 | Under 0.2 Ω (Acceptable) |
| 15 | Tungsten boride | 100 | Under 0.2 Ω (Acceptable) |
| 16 | Lanthanum boride | 100 | Under 0.2 Ω (Acceptable) |
| 17 | Molybdenum silicide | 70 | Under 0.2 Ω (Acceptable) |
|  | + Tantalum silicide | 30 |  |
| 18 | Titanium boride | 50 | Under 0.2 Ω (Acceptable) |
|  | + Niobium boride | 50 |  |
| 19 | Chromium silicide | 30 | Under 0.2 Ω (Acceptable) |
|  | + Zirconium boride | 30 |  |
|  | + Lanthanum boride | 40 |  |
| 20 | Molybdenum | 100 | Under 0.2 Ω (Acceptable) |
|  | + Niobium | 2 |  |
| 21 | Tungsten | 100 | Under 0.2 Ω (Acceptable) |
|  | + Yttrium | 5 |  |
| 22 | Tungsten carbide | 100 | Under 0.2 Ω (Acceptable) |
|  | + Tantalum | 5 |  |
| 23 | Tungsten | 100 | Under 0.2 Ω (Acceptable) |
|  | + Niobium | 1 |  |
|  | + Yttrium | 1 |  |
| 24 | Molybdenum | 100 | Under 0.2 Ω (Acceptable) |
|  | + Yttrium | 5 |  |
|  | + Tantalum | 4 |  |
| 25 | Tungsten carbide | 100 | Under 0.2 Ω (Acceptable) |
|  | + Niobium | 1 |  |
|  | + Tantalum | 10 |  |
| 26 | Tungsten | 100 | Under 0.2 Ω (Acceptable) |
|  | + Niobium | 4 |  |
|  | + Yttrium | 1 |  |
|  | + Tantalum | 2 |  |
| 27 | Tungsten | 100 | Under 0.2 Ω (Acceptable) |
|  | + Nickel | 1 |  |
| 28 | Molybdenum | 100 | Under 0.2 Ω (Acceptable) |
|  | + Chromium | 2 |  |
| 29 | Tungsten carbide | 100 | Under 0.2 Ω (Acceptable) |
|  | + Nickel | 1 |  |
|  | + Chromium | 0.5 |  |
| 30 | Tungsten | 100 | Under 0.2 Ω (Acceptable) |
|  | + Niobium | 5 |  |
|  | + Nickel | 1 |  |
| 31 | Molybdenum | 100 | Under 0.2 Ω (Acceptable) |
|  | + Yttrium | 2 |  |
|  | + Tantalum | 2 |  |
|  | + Chromium | 1 |  |
| 32 | Molybdenum silicide | 30 | Under 0.2 Ω (Acceptable) |
|  | + Tungsten | 70 |  |
|  | + Nickel | 0.7 |  |
| 33 | Titanium boride | 50 | Under 0.2 Ω (Acceptable) |
|  | + Molybdenum | 50 |  |
|  | + Niobium | 10 |  |

| Comparative sample | Composition of conductive material in metallized layer (parts by weight) | | Resistance (Ω) (Evaluation) |
|---|---|---|---|
| 1' | Molybdenum | 100 | Infinite because of being oxidized (Rejected) |
| 2' | Tungsten | 100 | Infinite because of being oxidized (Rejected) |
| 3' | Tungsten carbide | 100 | Infinite because of being oxidized (Rejected) |
| 4' | Molybdenum | 50 | Infinite because of being oxidized (Rejected) |
|  | + Tungsten | 50 |  |
| 5' | Molybdenum | 30 | Infinite because of being oxidized (Rejected) |
|  | + Tungsten | 40 |  |
|  | + Tungsten carbide | 30 |  |

As is clear from the explanation described above, this invention provides a product in which the metallized layer is formed into a sintered body having the aforementioned composition. Owing to this, the conductivity of metallized layer is not injured even when the metallized layer is exposed to an oxidative atmosphere and, furthermore, the adhesive strength to the ceramic substrate is excellent. Since the conductive layer consisting of expensive noble metal or noble metal alloy is wholly or partially replaced with said metallized layer, the ceramic body of this invention can be provided inexpensively. As above, the ceramic body of this invention can sweep away all the disadvantages of the hitherto known ceramic bodies of this type, and it brings about a great advantage in the industry.

What is claimed is:

1. A process for producing a ceramic body having a metallized layer which comprises tape-casting a ceramic slurry to form a ceramic green sheet, screen printing and drying a plurality of metallizing paste layers comprising one or more of a high melting point metal or alloy unmelted at a firing temperature of the ceramic substrate and containing, based on 100 parts by weight of metal or alloy, 0.5 to 25 parts by weight of niobium, 0.5 to 10 parts by weight of yttrium, 0.5 to 10 parts by weight of tantalum, 0.5 to 25 parts by weight of a mixture of niobium and yttrium, 0.5 to 25 parts by weight of a mixture of yttrium and tantalum, 0.5 to 25 parts by weight of a mixture of niobium and tantalum, 0.5 to 25 parts by weight of a mixture of niobium, yttrium and tantalum, 0.05 to 3 parts by weight of nickel, 0.5 to 4 parts by weight of chromium or 0.05 to 3 parts by weight of a mixture of nickel and chromium; screen printing and drying insulating paste to separate, at least in part, said metallized layers from one another; and firing the composite so formed at a temperature of 1450° C. to 1600° C. in a reducing atmosphere; and thereafter screen printing and drying a noble metal or noble metal alloy paste on the metallized layer and firing the resulting composite at a temperature of 500° C. to 900° C. in an oxidative atmosphere.

2. The process according to claim 1 wherein multiple layers of metallized paste are screen printed on the ceramic green sheet each of said layers being separated from one another by an insulating paste.

3. The process according to claims 1 or 3 which comprises further screen printing and drying a noble metal or noble metal alloy paste on the metallized layer and firing the resulting composite at a temperature of 500° to 900° C. in an oxidative atmosphere.

4. A process for producing a ceramic body having a metallized layer which comprises tape-casting a ceramic slurry to form a ceramic green sheet, screen printing and drying at least one metallizing paste comprising one or more of a silicide of transition metals selected from the elements consisting of Groups V and VI of the periodic table; one or more of a boride of lanthanum and a boride of a transition metal selected from Groups IV, V and VI of the periodic table; or a high melting point metal or alloy unmelted at a firing temperature of the ceramic substrate and containing, based on 100 parts by weight of metal or alloy, 0.5 to 25 parts by weight of niobium, 0.5 to 10 parts by weight of yttrium, 0.5 to 10 parts by weight of tantalum, 0.5 to 25 parts by weight of a mixture of niobium and yttrium 0.5 to 25 parts by weight of a mixture of yttrium and tantalum, 0.5–25 parts by weight of a mixture of niobium and tantalum, 0.5–25 parts by weight of a mixture of niobium, yttrium and tantalum, 0.05 to 3 parts by weight of nickel, 0.5 to 4 parts by weight of chromium or 0.05 to 3 parts by weight of a mixture of nickel and chromium and firing the composite so formed at a temperature of 1450° C. to 1600° C. in a reducing atmosphere.

* * * * *

UNITED STATES PATENT AND TRADEMARK OFFICE
CERTIFICATE OF CORRECTION

PATENT NO. : 4,397,800
DATED : Aug. 9, 1983
INVENTOR(S) : Suzuki et al.

It is certified that error appears in the above-identified patent and that said Letters Patent are hereby corrected as shown below:

Claim 3, col. 7, line 3: change "3" to --2--.

Claim 4, col. 8, line 6: insert a comma after "yttrium".

Signed and Sealed this

Eighteenth Day of September 1984

[SEAL]

Attest:

GERALD J. MOSSINGHOFF

*Attesting Officer*  *Commissioner of Patents and Trademarks*